United States Patent
Hsu et al.

(10) Patent No.: US 6,670,090 B1
(45) Date of Patent: Dec. 30, 2003

(54) POSITIVE WORKING PHOTOSENSITIVE COMPOSITION, ARTICLE AND PROCESS FOR FORMING A RELIEF PATTERN

(75) Inventors: Steve Lien-Chung Hsu, Tainan (TW); Jinn-Shing King, Hsinchu (TW); Po-I Lee, Kaohsiung (TW); Jhy-Long Jeng, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/232,412

(22) Filed: Sep. 3, 2002

(51) Int. Cl.$^7$ .............................. G03F 7/023; G03F 7/30
(52) U.S. Cl. .................. 430/190; 430/165; 430/191; 430/192; 430/193; 430/326
(58) Field of Search .................................. 430/165, 190, 430/191, 192, 193, 326

(56) References Cited

U.S. PATENT DOCUMENTS

| | | | | |
|---|---|---|---|---|
| 4,339,521 A | * | 7/1982 | Ahne et al. ................. | 430/192 |
| 4,395,482 A | * | 7/1983 | Ahne et al. ................. | 430/326 |
| 4,880,722 A | * | 11/1989 | Moreau et al. ............. | 430/192 |
| 5,037,720 A | * | 8/1991 | Khanna ...................... | 430/190 |
| 5,260,162 A | * | 11/1993 | Khanna et al. ............. | 430/190 |
| 5,449,584 A | * | 9/1995 | Banba et al. ............... | 430/190 |
| 6,177,225 B1 | * | 1/2001 | Weber et al. ............... | 430/190 |

* cited by examiner

*Primary Examiner*—John S. Chu
(74) *Attorney, Agent, or Firm*—Birch, Stewart, Kolasch & Birch, LLP

(57) ABSTRACT

The present invention relates to a positive-working photosensitive composition comprising a partially diazonaphthoquinone (DNQ) capped polyamic ester with a capping level of about 5–80 molar %; a photosensitive agent and a solvent. The composition shows a high photosensitivity and leaves a relief pattern with high resolution and low dark film loss.

24 Claims, No Drawings

POSITIVE WORKING PHOTOSENSITIVE COMPOSITION, ARTICLE AND PROCESS FOR FORMING A RELIEF PATTERN

BACKGROUND OF THE INVENTION

1. Field of the Invention

The present invention relates to a positive working photosensitive composition. In particular, the present invention relates to a positive working, aqueous base developable photosensitive polyimide precursor composition.

2. Description of the Related Art

Polyimide has been widely used in microelectronics as a protection layer, an insulation layer or a packaging material. Recently, photosensitive polyimide has attracted great interest not only because it can be easily synthesized but also because it is a substitute of the conventional photoresist in microelectronic applications.

Thus, various methods have been disclosed for preparing the positive-working photosensitive polyimide. U.S. Pat. No. 4,093,461 discloses a positive working photoresist composition comprising an orthoquinone diazide or naphthoquinone diazide and a polyamic acid condensation product. U.S. Pat. No. 5,399,655 discloses a positive working photodefinable polyimide precursor which makes use of chemical amplification based on photoacid catalyzed cleavage of acid labile poly (amic acetal esters). T. Ueno et al., Polymer Material Science Engineering., 77, 465(1997) describes a positive alkali developable photosensitive polyimide based on polyimide precursor with pendant carboxylic acid and DNQ (diazonaphthoquinone) sensitizer.

SUMMARY OF THE INVENTION

The positive working photosensitive composition of the present invention comprises a polyimide precursor, a photosensitive agent and a solvent. The polyimide precursor is a partially diazonaphthoquinone (DNQ) capped polyamic ester having the following structure:

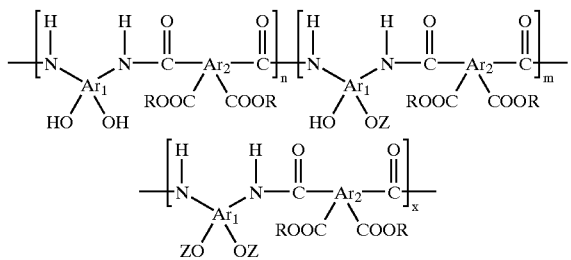

wherein, $Ar_1$ is a tetravalent aromatic group and $Ar_2$ is selected from the following groups: a tetravalent aromatic group, a aliphatic group, a heterocyclic group, or mixture of thereof. R is selected from following groups: an alkyl, an aryl, or other substituted aryl and n+m+x=1, wherein $0.05 \leq m+x \leq 0.80$, preferably $0.15 \leq m+x \leq 0.75$ and more preferably $0.25 \leq m+x < 0.6$; and Z is one of the following groups:

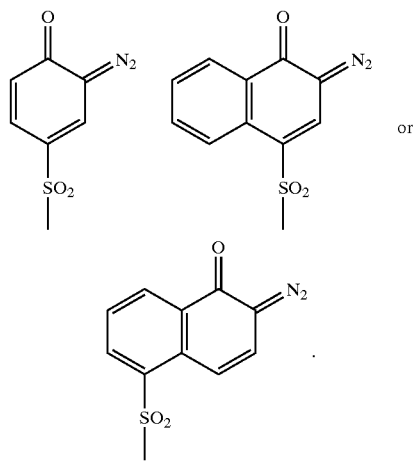

The present invention also relates to the preparation of the positive working photosensitive polyimide precursor. In addition, the present invention teaches a photosensitive article comprising a support coated with a layer comprising a partially diazonaphthoquinone (DNQ) capped polyamic ester, a photosensitive agent and a solvent. Finally, the present invention teaches the process of using the positive working photosensitive composition to form the relief pattern.

DETAILED DESCRIPTION OF THE INVENTION

In a preferred embodiment, the composition of the present invention comprises a partially diazonaphthoquinone (DNQ) capped polyimide precursor bearing phenolic hydroxyl groups, a photosensitive agent, and a solvent.

The polyimide precursor is made of a polyamic ester and the phenolic hydroxyl groups to render the aqueous base solubility of the polyimide precursor. The DNQ capping on the phenolic hydroxyl group can enlarge the difference of the dissolution rate before and after exposure and also can significantly reduce the dark film loss compared to the uncapped polyimide precursor. When the DNQ capping level increases to about 50% (in molar %), the dissolution rate of the exposed-film also increases. When the capping level increases to more than 50% (in molar %), the dissolution rate decreases abruptly.

The "swelling" phenomena also found in the un-dissolved portion of the film might be caused by the crosslink between the DNQ moieties and the polymer molecules when the capping level reaches to a level above 75% (in molar %). T Omote et. al., Macromolecules, 1990, 23, 4796–4802 discloses the same situation in their 100% DNQ capped polyimide system. In addition, the 100% DNQ capped polyimide precursor also shows poor adhesion to the silicon wafer.

A diazonaphthoquinone (DNQ) photosensitive agent is also added as the dissolution inhibitor for the uncapped portion of the polymer during the aqueous base development. After exposure to the actinic light such as x-rays, electron beam rays, ultraviolet (UV) rays and visible light rays, both the DNQ portions in the capped polyimide precursor and the added photosensitive agent are converted to the indenecarboxylic acid that increases the dissolution rate of the polyamic ester in the exposed region. Optionally, an adhesion promoter such as aminosilane may also be added to increase the adhesion.

After the photolithographic process, the patterned layer is converted to a heat resistant polyimide coating by application of additional heating. This resin composition can be used in microelectronic device fabrication applications as a thermal or mechanical stress buffer coating, an alpha particle barrier film, an interlayer dielectric, or a packaging material.

The present invention provides a positive working photosensitive composition comprising a partially DNQ capped polyamic ester bearing hydroxyl groups, having the following structure:

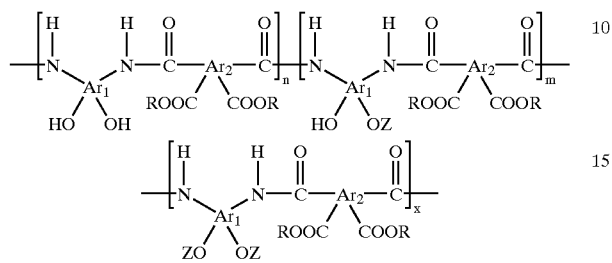

wherein $Ar_1$ is a tetravalent aromatic group having one of the following structures but is not limited to moieties with the structure:

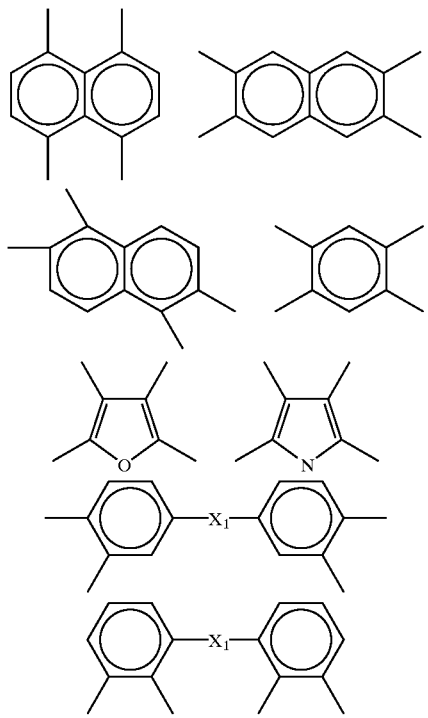

wherein $X_1$ is

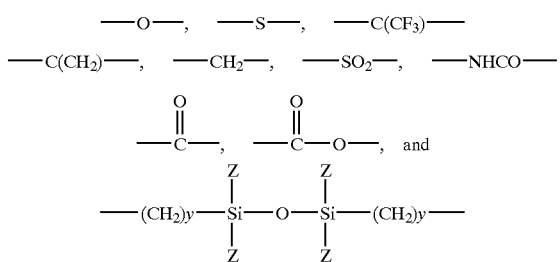

wherein Z=H or alkyl, y=1~20 and $Ar_2$ is a tetravalent aromatic group having one of the following structures:

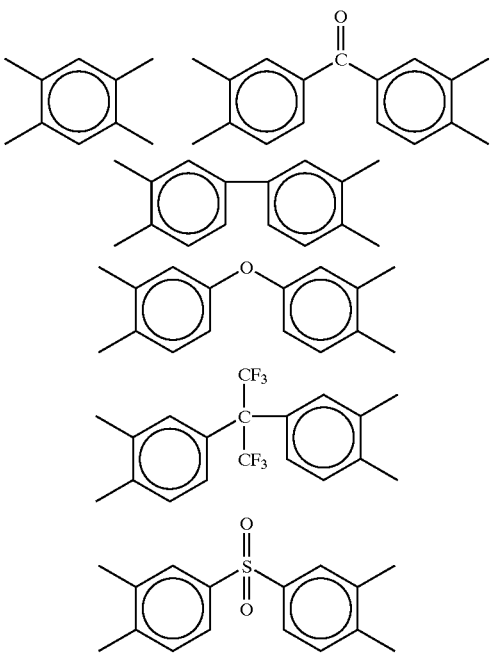

In addition, $Ar_2$ may be an aliphatic group, a heterocyclic group, or mixtures thereof. R is an alkyl, aryl, or other substituted aryl having one of the following structures but is not limited to moieties with the structure:

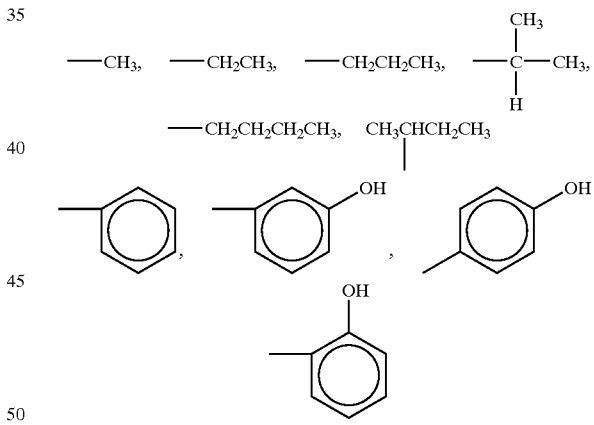

wherein n+m+x=1 and $0.05 \leq m+x \leq 0.80$, preferably $0.15 \leq m+x \leq 0.75$ and more preferably $0.25 \leq m+x \leq 0.6$; and Z is one of the following groups:

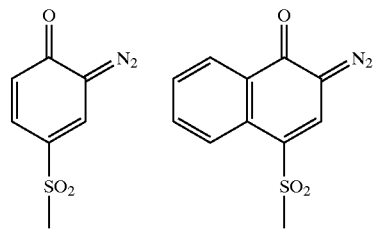

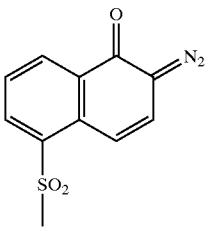

The photosensitive agent consists of a diazoquinone compound and is about 1–50% weight percentage of the composition. The suitable diazoquinone compound is one of the following structures:

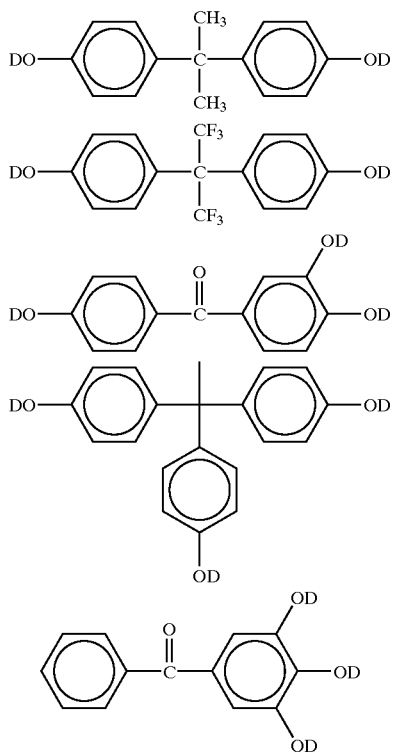

wherein D is H or one of the following compounds:

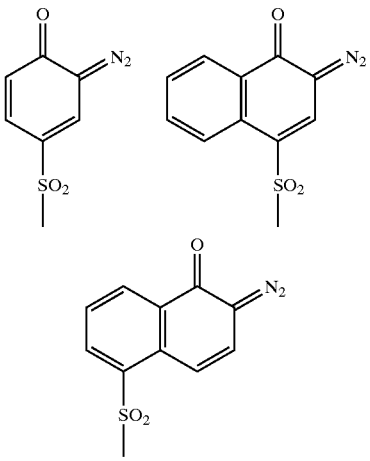

The positive-working photosensitive composition is used as a solution dissolved in a solvent. Suitable solvents include, but are not limited to, organic solvents, such as N-methylpyrrolidone (NMP), γ-butyrolactone (GBL), N,N-dimethylacetamide (DMAc), N,N-dimethylformamide (DMF), or mixtures therefore. Optionally, an adhesion promoter such as the aminosilane may be further added to increase the adhesion of this composition.

The present invention also teaches a process for forming a relief pattern comprising the steps of: (a) coating the positive-working photosensitive composition solution on a suitable substrate by a method such as spin coating; (b) prebaking the coated substrate; (c) exposing the prebaked coated substrate to the actinic light; (d) developing the exposed coated substrate with an aqueous base developer, thereby forming a developed substrate; and (e) curing the developed substrate, thereby forming a relief pattern.

In the first step, the positive working photosensitive composition is coated on a suitable substrate such as a silicon substrate and then a photosensitive article comprising a support coated thereon a layer of positive working photosensitive composition is formed. The coating methods include but are not limited to spin coating, roller coating, screen coating, curtain coating, dip coating, and spray coating. In a preferred embodiment the resulting film is prebaked at a temperature of 7014 120° C. for several minutes to evaporate the solvent. Subsequently, the coated substrate is exposed to the actinic light through a mask. X-rays, electron beam rays, ultraviolet rays, visible light rays and the like can be used as the actinic light sources.

The exposed coated substrate is then developed by an aqueous base developer and a relief pattern is obtained. The aqueous base developer includes the solution of alkalis such as an inorganic alkali (e.g., potassium hydroxide, sodium hydroxide), primary amines (e.g., ethylamine), secondary amines (e.g., diethylamine), tertiary amines (e.g. triethylamine), quaternary (e.g., tetramethylammonium hydroxide), and mixture thereof. The preferable developers are those containing tetramethylammonium hydroxide. The development can be carried out by means of immersion, spray, pudding or other similar methods.

The relief pattern is then rinsed by deionized water. In a perfered embodiment the film is then cured at 250–400° C. to convert the polyamic ester precursor to the heat resistant polyimide.

The following examples are provided to further illustrate the present invention. However, it should be understood that the present invention is not limited to the examples described.

EXAMPLES

Example 1

Synthesis of BisAPAF/PMDA/butanol Polyamic Ester

Using a 250 mL three-necked round bottom flask equipped with a mechanical stirrer and nitrogen inlet, 10.91 g (50 mmol) of pyromellitic dianhydride (PMDA), 7.40 g (100 mmol) of n-butanol and 115 g of N-methyl-2-pyyrolidone (NMP) were added. The mixture was heated at 80° C. and stirred at this temperature for 4 hours. The solution was then cooled to ambient temperature and 16.63 g (200 mmol) of pyridine and 19.50 g (100 mmol) of phenylphosphonic dichloride were further added. The solution was then stirred at ambient temperature for 2 hours and then cooled to 0–4° C. Another 18.30 g (50 mmol) of hexafluoro-2,2-bis(3-amino-4-hydroxyphenyl)propane (BisAPAF) was added. The mixture was stirred at 0–4° C. for 1 hour and then stored at ambient temperature for 8 hours.

The resulting viscous solution was precipitated in 1000 mL of methanol. The polymer was collected by filtration and washed with deionized water three times. The polymer was dried under vacuum at 80° C. for 24 hours. The inherent viscosity of the polymer was 0.23 dL/g measured in NMP at the concentration of 0.5 g/dL at 30° C.

Example 2

Synthesis of a 25% (Molar %) DNQ Capped BisAPAF/PMDA/butanol Polyamic Ester

Using a 250 mL three-necked round bottom flask equipped with a mechanical stirrer and a condenser, 6.96 g (10 mmol) of BisAPAF-PMDA polyamic acid n-butyl ester and 50 mL tetrahydrofuran (THF) were added. The solution was stirred until the polymer was totally dissolved and then 1.343 g (5 mmol) of 1,2-naphthoquinone diazide-5-sulfonyl chloride was added. After stirring for 10 min, 0.2 g (2 mmol) of triethylamine was added to the solution and the reaction mixture was stirred for 5 hours.

The solution was precipitated in 1000 mL of deionized water. The polymer was collected by filtration and washed with de-ionized water five times. The polymer was dried under vacuum at 45° C. for 24 hours. The appearance of N=N absorption at 2119 cm$^{-1}$ and S=O absorption at 1380 cm$^{-1}$ indicated that the DNQ was attached to the polymer.

Example 3–5

Substantially the same procedure as described in Example 2 was used for the preparation of a 50% (molar %), 75% (molar %) and 100% (molar %) DNQ capped BisAPAF/PMDA/butanol Polyamic ester except that the amounts of 1,2-naphthoquinone diazide-5-sulfonyl chloride and triethylamine were increased from two to four times. The polymer was dried under vacuum at 45° C. for 24 hours. The appearance of N=N absorption at 2119 cm$^{-1}$ and S=O absorption at 1380 cm$^{-1}$ indicated that the DNQ was attached to the polymer.

Example 6

Preparation of Photosensitive Composition from 25% DNQ Capped BisAPAF/PMDA/butanol Polyamic Ester and Lithographic Evaluation The following positive-working photosensitive composition was prepared:

(a) polyamic ester (from example 2): 5 g
(b) photosensitive compound: PIC-3 (ester of 2,3,4-trihydroxybenzophenone with 1,2-Napthoquinone-2-diazo-5-sulfonyl chloride from Koyo Chemicals, Tokyo, Japan) 1.25 g

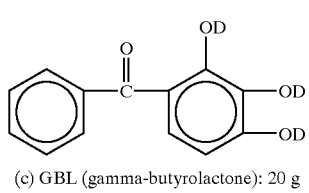

(c) GBL (gamma-butyrolactone): 20 g

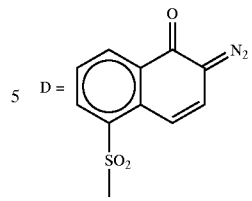

The composition was then spin coated onto a silicon wafer and softbaked on an airflow clean room oven at 105° C. for 40 minutes to obtain a film thickness about 3 μm. The coated silicon wafer was then exposed to an unfiltered mercury arc lamp with a energy of 150 mJ/cm$^2$ and with a measured wavelength from 250–400 nm and then developed in a 1.5 wt % tetramethylammonium hydroxide (TMAH) developer. After a 350° C., 60 minutes baking in a nitrogen atmosphere, a heat resistant relief pattern was obtained and showed a resolution of 5 micron line and space pattern. The dark film loss of the pattern was about 6% of the originally coated thickness.

Comparative Example 1

Preparation of Photosensitive Composition From BisAPAF/PMDA/butanol Polyamic Ester and Lithographic Evaluation The composition and lithographic evaluation procedure of polyamic esters were the same as that of example 6 except that the polyamic ester was from example 1. A resolution of 10 μm line and space pattern can be obtained in a film thickness about 3 μm. The dark film loss of the pattern was 22% of the originally coated thickness.

Comparative Example 2

Preparation of Photoresist Photosensitive Composition From a 100% DNQ Capped PMDA/BisAPAF/butanol Polyamic Ester and Lithographic Evaluation The composition and lithographic evaluation procedure of the 100% DNQ capped polyamic esters were the same as that of example 6. A resolution of 10 μm line and space pattern can be obtained in a film thickness about 3 μm, but the portions of the undissolved film were swelling. And the dissolution rates between exposed and unexposed portions are shown in Table 1.

TABLE 1

| Polyamic ester from | Capping level (%) | Unexposed portions (μm/min) | Exposed portions (μm/min) |
|---|---|---|---|
| Example 2 | 25 | 0.71 | 4.42 |
| Example 3 | 50 | 0.44 | 7.76 |
| Example 4 | 75 | 0.22 | 4.04 |
| Example 5 | 100 | 0.09 | 2.27 |

Referring to table 1, the capping level shown above has the same meaning with "m+x" of the polyamic ester. According to above lithographic evaluation results, when the capping level reaches 50%, it shows the highest dissolution rate of the exposed portions but when the capping level is over 50%, the dissolution rate of the exposed and unexposed portions both drops abruptly, but when the capping level is between 25~75%, it still shows a great dissolution rate difference between the exposed portions and unexposed portions.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A positive-working photosensitive composition comprising:
   (a) a partially diazonaphthoquinone (DNQ) capped polyamic ester, wherein the partially diazonaphthoquinone (DNQ) capped polyamic ester has a capping level of about 5–80 molar %;
   (b) a photosensitive agent; and
   (c) a solvent.

2. The positive working photosensitive composition as claimed in claim 1, wherein the partially DNQ capped polyamic ester has the following structure:

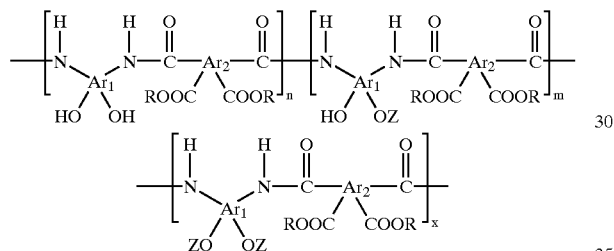

wherein n+m+x=1 and 0.15≦m+x≦0.75 and Z is one of the following groups:

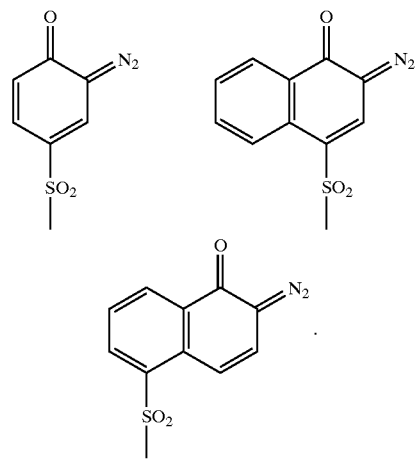

3. The positive working photosensitive composition as claimed in claim 1, further comprising an adhesion promoter.

4. The positive working photosensitive composition as claimed in claim 3, wherein the adhesion promoter is aminosilane.

5. The positive working photosensitive composition as claimed in claim 1, wherein the partially DNQ capped polyamic ester has the following structure:

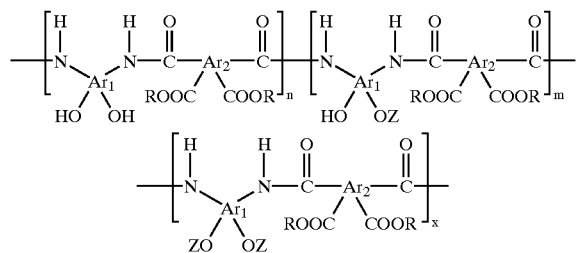

wherein n+m+x=1 and 0.25≦m+x≦0.6 and Z is one of the following group:

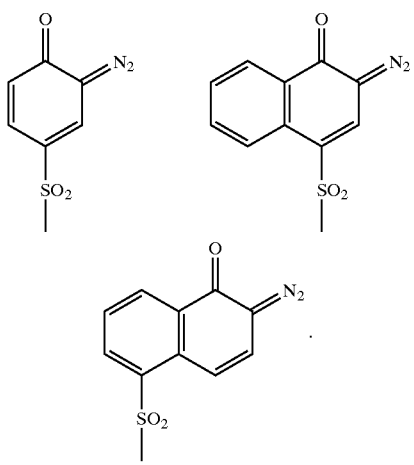

6. The positive working photosensitive composition as claimed in claim 1, wherein the Ar$_1$ is a tetravalent aromatic group having one of the following structures:

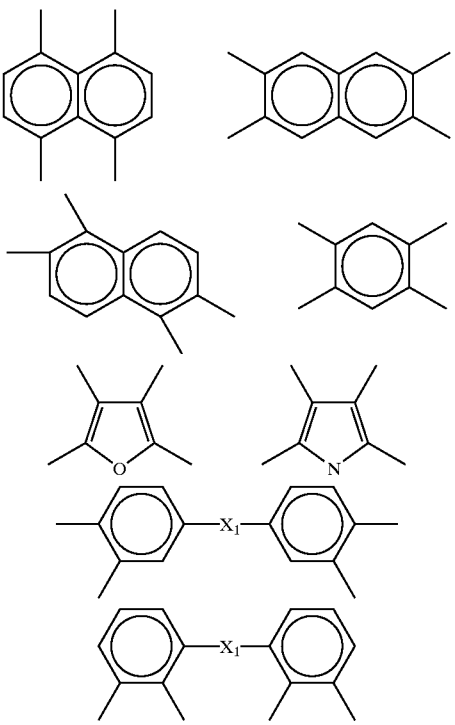

wherein $X_1$ is

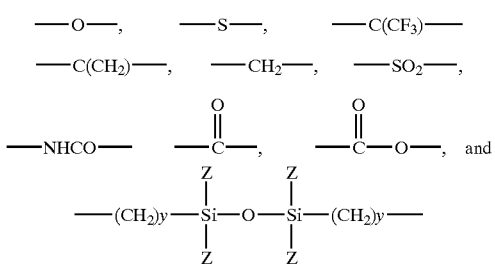

wherein Z=H or alkyl, y=1~20 and $Ar_2$ is a tetravalent aromatic group having one of the following structures:

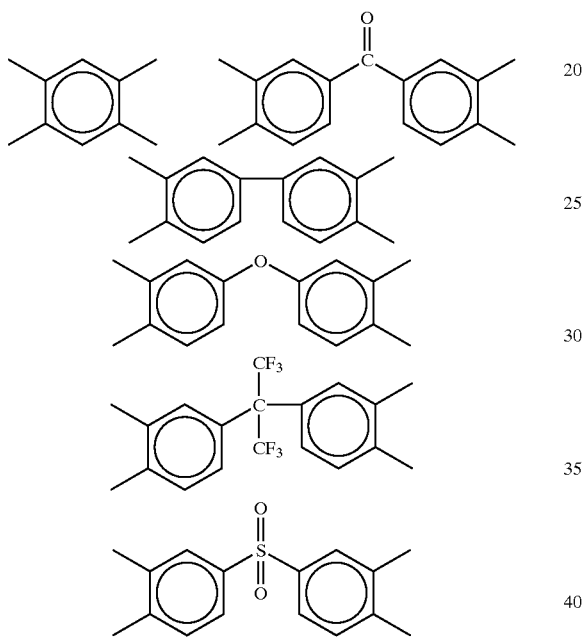

7. The positive working photosensitive composition as claimed in claim 6, wherein the $Ar_1$ is a tetravalent aromatic group having one of the following structures

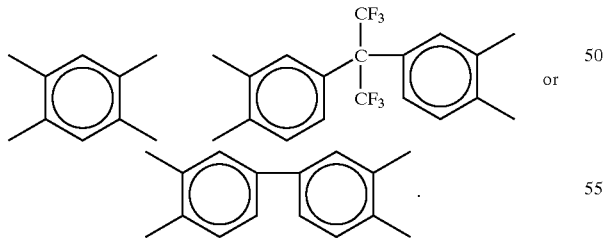

or

8. The positive working photosensitive composition as claimed in claim 1, wherein the photosensitive agent is about 1–50% weight percentage of the composition.

9. The positive working photosensitive composition as claimed in claim 1, wherein the photosensitive agent comprises a diazoquinone compound with one of the following structures:

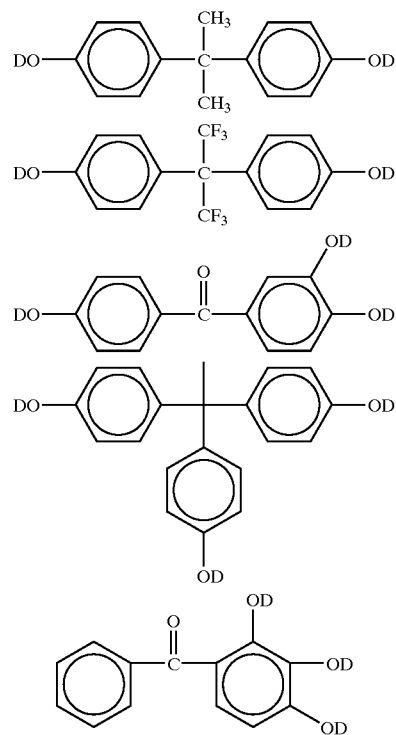

wherein each of D is H or one of the following compounds:

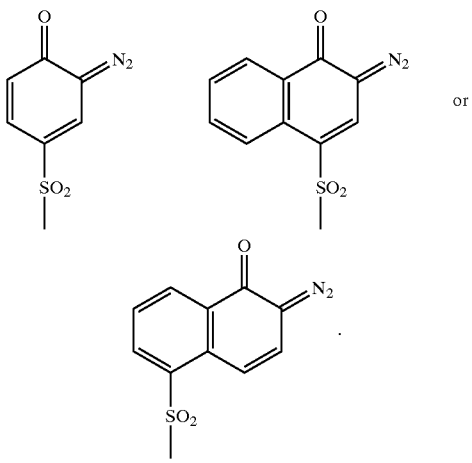

10. The positive working photosensitive composition as claimed in claim 1, wherein the solvent is N-methylpyrrolidone, γ-butyrolactone, N,N-dimethylacetamide, N,N-dimethylformamide, or mixtures therefore.

11. The positive working photosensitive composition as claimed in claim 1, wherein R is one of the following structures:

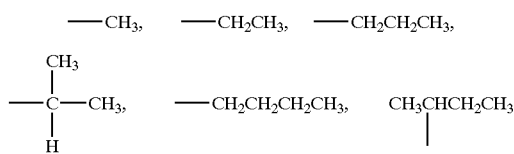

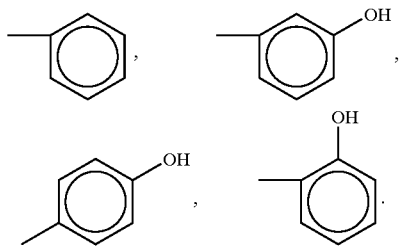

12. A process for forming a relief pattern, comprising the steps:
(a) applying the positive photosensitive composition as claimed in claim 1 onto a substrate;
(b) prebaking the coated substrate;
(c) exposing the coated substrate to the actinic light;
(d) developing the exposed coated substrate with an aqueous developer, thereby forming a developed substrate; and
(e) curing the developed substrate at elevated temperature, thereby forming the relief pattern.

13. The process as claimed in claim 12, wherein the actinic light is x-rays, electron beam rays, ultraviolet rays or visible light rays.

14. The process as claimed in claim 12, wherein said aqueous developer is a solution of alkalis, primary amines, secondary amines, tertiary amines, alcoholamines, quaternary ammonium salts, or mixtures thereof.

15. The process as claimed in claim 14, wherein the developer is a solution of quaternary ammonium salts such as tetramethylammonium hydroxide.

16. The process as claimed in claim 12, wherein the substrate is a silicon substrate.

17. The process as claimed in claim 12, wherein the prebaking is carried out at a temperature about 70–120° C. to evaporate the solvent.

18. The process as claimed in claim 12, wherein the developing can be carried out by immersion, spray, or pudding.

19. The process as claimed in claim 12, wherein the curing temperature is carried out at 250–400° C. to convert the polyamic ester to heat resistant polyimide.

20. A photosensitive article, comprising a support coated thereon a layer comprising a partially diazonaphthoquinone (DNQ) capped polyamic ester, a photosensitive agent and a solvent.

21. The article as claimed in claim 20, wherein the partially diazonaphthoquinone (DNQ) capped polyamic ester having a capping level about 5–80 molar %.

22. The article as claimed in claim 20, wherein the photosensitive agent comprising a diazoquinone compound with one of the following structures:

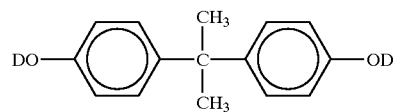

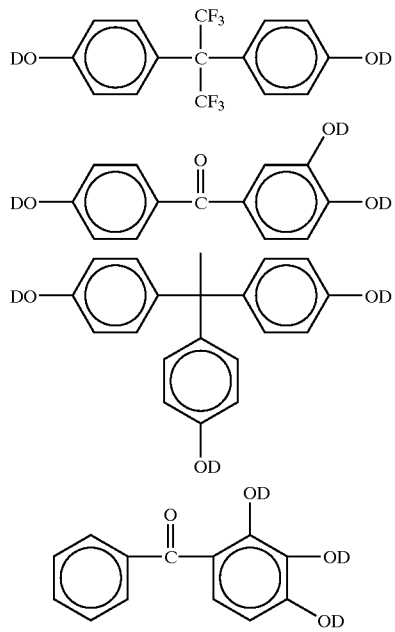

wherein each of D is H or one of the following compounds:

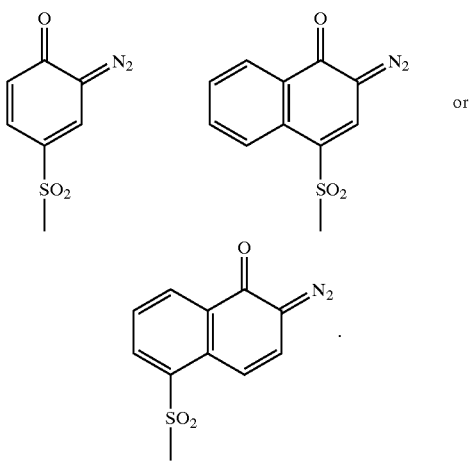

23. The article as claimed in claim 20, wherein the solvent is N-methylpyrrolidone, γ-butyrolactone, N,N-dimethylacetamide, N,N-dimethylformamide, or mixtures therefore.

24. The article as claimed in claim 20, wherein the support is a silicon substrate.

* * * * *